(12) United States Patent
Wang et al.

(10) Patent No.: US 11,437,328 B2
(45) Date of Patent: Sep. 6, 2022

(54) DEVICE THERMAL MANAGEMENT

(71) Applicant: QUALCOMM Incorporated, San Diego, CA (US)

(72) Inventors: Peng Wang, San Diego, CA (US); Le Gao, San Diego, CA (US); Jorge Luis Rosales, San Diego, CA (US); Don Le, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/874,542

(22) Filed: May 14, 2020

(65) Prior Publication Data

US 2020/0365522 A1 Nov. 19, 2020

Related U.S. Application Data

(60) Provisional application No. 62/848,896, filed on May 16, 2019.

(51) Int. Cl.
| | |
|---|---|
| *H01L 23/552* | (2006.01) |
| *H01L 23/427* | (2006.01) |
| *H01L 25/065* | (2006.01) |
| *H01L 21/48* | (2006.01) |
| *H01L 23/00* | (2006.01) |

(52) U.S. Cl.
CPC ........ *H01L 23/552* (2013.01); *H01L 21/4817* (2013.01); *H01L 23/427* (2013.01); *H01L 24/81* (2013.01); *H01L 25/0655* (2013.01); *H01L 24/16* (2013.01); *H01L 2224/16225* (2013.01); *H01L 2924/3025* (2013.01)

(58) Field of Classification Search
None
See application file for complete search history.

(56) References Cited

U.S. PATENT DOCUMENTS

| | | | |
|---|---|---|---|
| 10,561,041 B2 | 2/2020 | Bozorgi | |
| 10,775,856 B1* | 9/2020 | Morgan | ............... H05K 9/0032 |
| 2002/0076547 A1 | 6/2002 | Kalinoski et al. | |

(Continued)

FOREIGN PATENT DOCUMENTS

| | | |
|---|---|---|
| CN | 104902727 A | 9/2015 |
| CN | 109890174 A | 6/2019 |
| CN | 110234216 A | 9/2019 |

OTHER PUBLICATIONS

International Search Report and Written Opinion—PCT/US2020/033187—ISA/EPO—dated Jul. 14, 2020.

*Primary Examiner* — Long Pham
(74) *Attorney, Agent, or Firm* — Loza & Loza, LLP/Qualcomm

(57) ABSTRACT

Aspects of the disclosure relate to thermal management of devices, such as mobile devices configured for wireless communication in wireless communication networks. A device includes a plurality of electronic components. An electromagnetic interference (EMI) shield is disposed on the electronic components, and a plurality of EMI gaskets are disposed between the electronic components. Each of the EMI gaskets surrounds a respective one of the plurality of electronic components. An evaporative cooler device embedded within the EMI shield is configured to transfer heat away from at least a portion of the electronic components.

28 Claims, 12 Drawing Sheets

(56) References Cited

U.S. PATENT DOCUMENTS

| | | |
|---|---|---|
| 2006/0126309 A1* | 6/2006 | Bolle .................... H05K 9/0033 |
| | | 361/719 |
| 2011/0025575 A1 | 2/2011 | Niederkorn et al. |
| 2016/0135336 A1* | 5/2016 | Wu .................... H05K 7/20472 |
| | | 361/714 |
| 2017/0163302 A1 | 6/2017 | Saeidi et al. |
| 2017/0188448 A1* | 6/2017 | Liang ...................... H01L 23/42 |
| 2017/0251569 A9* | 8/2017 | Yoo .................... H05K 7/20336 |
| 2019/0045666 A1* | 2/2019 | Liang ...................... H01L 23/42 |
| 2021/0153340 A1* | 5/2021 | Lee ...................... H05K 1/0236 |

\* cited by examiner

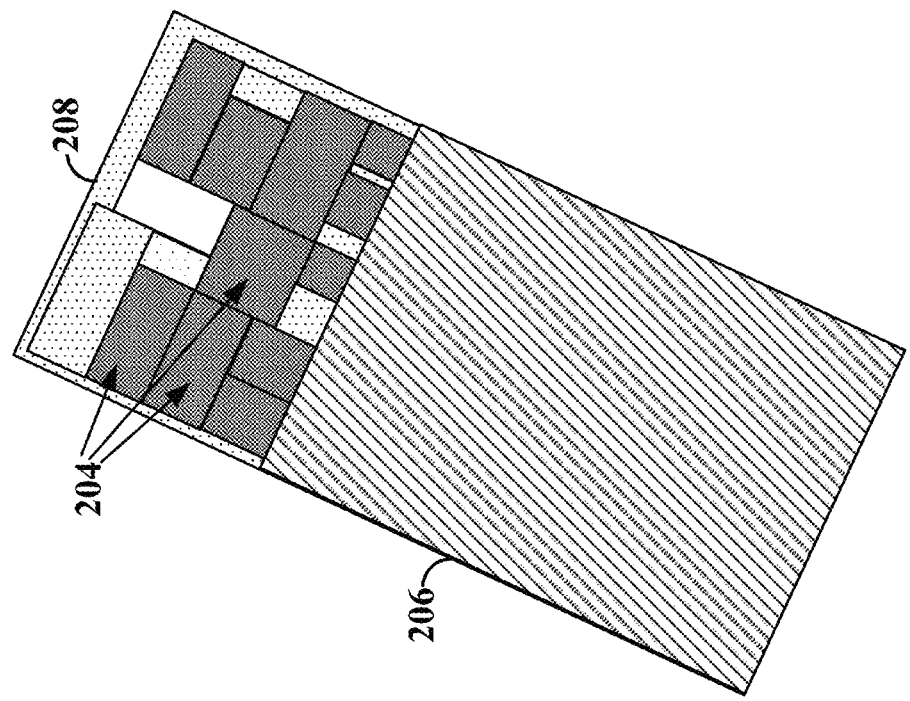
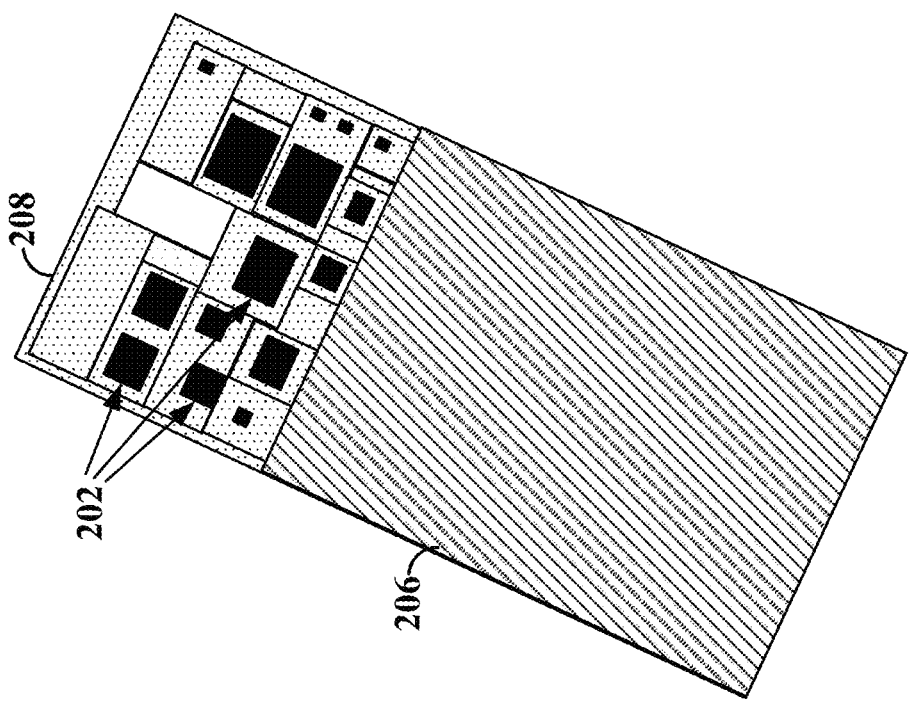
FIG. 2B
FIG. 2A

DEVICE THERMAL MANAGEMENT

PRIORITY CLAIM

This application claims priority to and the benefit of Provisional Patent Application No. 62/848,896, entitled "Mobile Device Thermal Management," filed in the U.S. Patent and Trademark Office on May 16, 2019, the entire contents of which are incorporated herein by reference as if fully set forth below in their entirety and for all applicable purposes.

TECHNICAL FIELD

The technology discussed below relates generally to electromagnetic interference (EMI) shielding within devices, and more particularly, to providing EMI shielding and thermal management in devices.

INTRODUCTION

In next-generation wireless communication devices, such as 5G or New Radio (NR) mobile devices, that consume very high power, system performance may be thermally limited by the chip junction temperature ($T_j$) and the device surface temperature ($T_{skin}$). In some examples, millimeter wave (mmW) 5G downlink or uplink operations may only be sustainable for a few minutes before $T_{skin}$ or $T_j$ reach the maximum temperature specifications, at which point the 5G throughput performance may be degraded to a lower data rate due to thermal mitigation procedures.

As the demand for 5G communication increases, research and development continue to advance 5G mobile device technologies to provide thermal solutions to reduce both $T_j$ and $T_{skin}$ in order to improve device performance.

BRIEF SUMMARY OF SOME EXAMPLES

The following presents a summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

In one example, a device is disclosed that includes a plurality of electronic components, an electromagnetic interference (EMI) shield disposed on the plurality of electronic components, an evaporative cooler device embedded within the EMI shield and configured to transfer heat away from at least a portion of the plurality of electronic components, and a plurality of EMI gaskets disposed between the plurality of electronic components. Each of the plurality of EMI gaskets surrounds a respective one of the plurality of electronic components.

Another example provides method for fabricating a device. The method includes mounting a plurality of electronic components on a printed circuit board and inserting electromagnetic interference (EMI) gaskets. Each of the EMI gaskets surrounds one of the plurality of electronic components. The method further includes attaching the EMI gaskets to the printed circuit board and providing an electromagnetic interference (EMI) shield disposed on the plurality of electronic components and the EMI gaskets. The EMI shield includes an evaporative cooler device embedded therein. The method further includes attaching the EMI gaskets to the EMI shield to form a respective seal around each of the plurality of electronic components.

Another example provides a method for thermal management in a device. The method includes preventing first electromagnetic interference (EMI) between a plurality of electronic components of the device and at least one external noise source external to the device during operation of the plurality of electronic components using an EMI shield disposed on the plurality of electronic components. The method further includes preventing second EMI between the plurality of electronic components during operation thereof using a plurality of EMI gaskets disposed between the plurality of electronic components. Each of the plurality of EMI gaskets surrounds a respective one of the plurality of electronic components. The method further includes transferring heat away from at least a portion of the plurality of electronic components during operation thereof utilizing an evaporative cooler device embedded within the EMI shield.

Another example provides a device including means for preventing first electromagnetic interference (EMI) between a plurality of electronic components of the device and at least one external noise source external to the device during operation of the plurality of electronic components. The means for preventing the first EMI is disposed on the plurality of electronic components. The device further includes means for preventing second EMI between the plurality of electronic components during operation thereof. The means for preventing the second EMI is disposed between the electronic components and configured to form respective seals around each of the plurality of electronic components. The device further includes means for transferring heat away from at least a portion of the plurality of electronic components during operation thereof. The means for transferring heat is embedded within the means for preventing the first EMI.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 2A is a diagram illustrating an exemplary printed circuit board (PCB) and middle frame of a mobile device.

FIG. 2B is a diagram illustrating exemplary electromagnetic interference (EMI) shielding of various electronic components of the mobile device.

DETAILED DESCRIPTION

Figure 1:
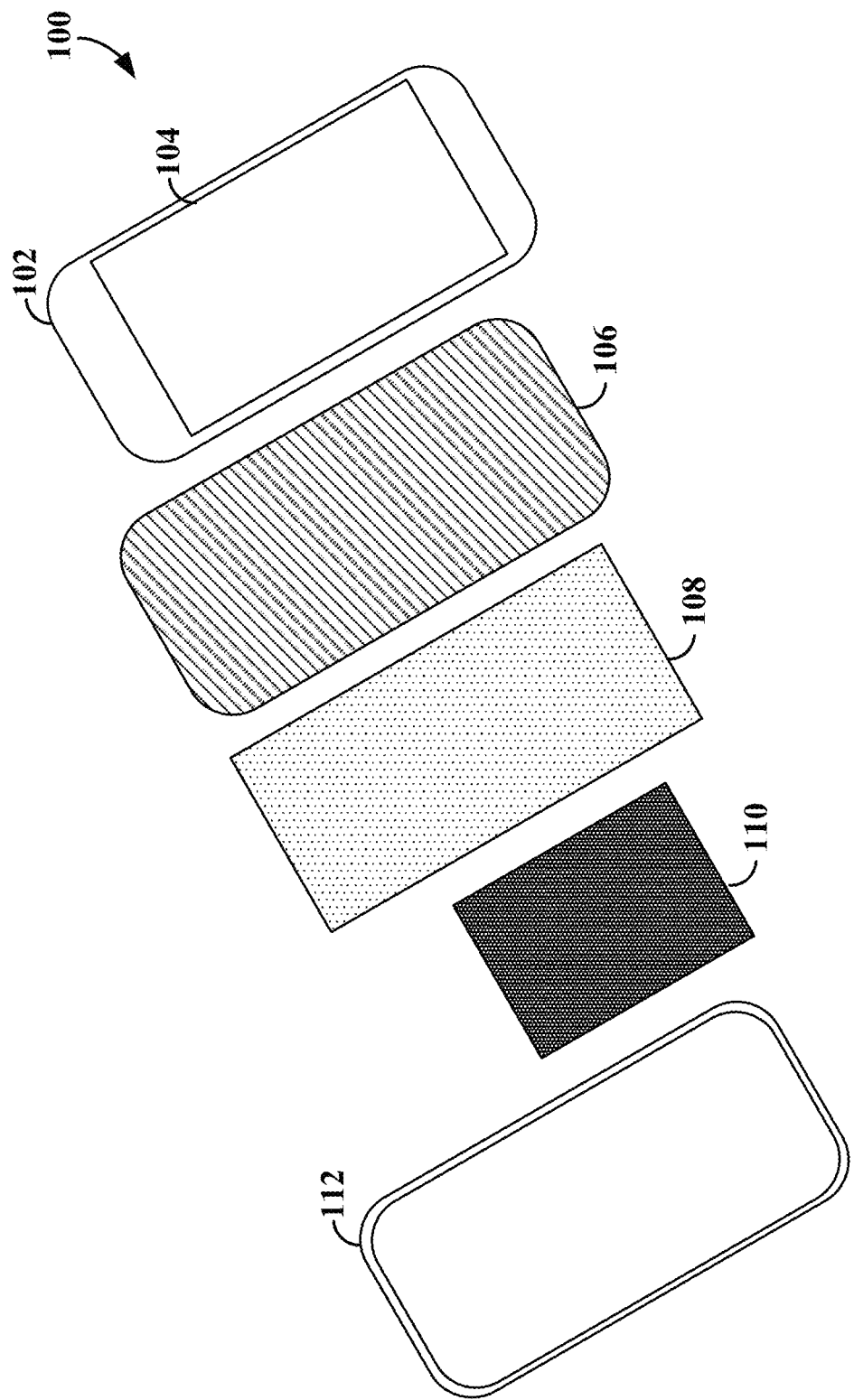
FIG. 1 is an exploded view of an exemplary mobile device.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Various aspects of the disclosure relate to mechanisms for improving the thermal performance of devices, such as mobile devices. A device can include a plurality of electronic components. In addition, an electromagnetic interference (EMI) shield may be disposed on the electronic components. To reduce the temperature of the device and the junction temperature of high-power electronic components, an evaporative cooler device can be embedded within the EMI shield. The evaporative cooler device is configured to transfer heat away from the high-power electronic component(s). In some examples, the evaporative cooler device may be a two-phase cooling device that includes an envelope and a vapor chamber surrounded by a wicker structure. The vapor chamber may further include a working fluid selected to evaporate into a vapor and condense back into a liquid over the operating temperature range.

In an aspect, the EMI shield may be configured as a plurality of EMI shield cans, each surrounding a respective one of the electronic components. In some examples, the EMI shield cans, together with the plurality of electronic components may be mounted on a printed circuit board. Each EMI shield can may further include a respective evaporative cooler device embedded therein to transfer heat away from each of the electronic components.

In another aspect, the EMI shield may be configured as an EMI shield plate including the embedded evaporative cooler device. The EMI shield plate may be disposed on the electronic components. In some examples, the EMI shield plate can include a metallic material (e.g., copper, aluminum, steel, titanium, or other suitable metallic materials) or a polymer-based material. For example, the EMI shield plate may be fabricated using a thin copper-based vapor chamber or polymer-based vapor chamber. The EMI shield plate can further include a metallic coating on the polymer-based material. For example, the coating may include copper, aluminum, nickel, titanium, or other suitable metallic materials. In addition, a plurality of EMI gaskets may be disposed between each of the electronic components to prevent EMI between the electronic components. Each of the EMI gaskets may surround one of the electronic components to form respective seals around each of the electronic components. In some examples, the EMI gaskets are formed of an electrically conductive rubber material.

In another aspect, the EMI shield may be configured as a middle frame of the device. The middle frame serves as an internal mechanical support for the device. In some examples, the middle frame is formed of a metallic material, such as copper, aluminum, steel, or other suitable metallic materials. The middle frame can include a housing covering the electronic components. The housing may include a top segment disposed on the electronic components and at least two external side segments disposed on respective sides of the housing. In one example, the evaporative cooler structure may be embedded within the top segment of the housing to cover the electronic components. In another example, the evaporative cooler device may be embedded within both the top segment and the at least two external side segments of the housing to surround the electronic components. In addition, EMI gaskets may be disposed between the electronic components.

FIG. 1 is an exploded view of an exemplary mobile device 100. The mobile device 100 may commonly be referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a wireless device, a wireless communications device, a remote device, a mobile subscriber station, an access terminal (AT), a mobile terminal, a wireless terminal, a remote terminal, a handset, a terminal, a mobile client, a cellular (cell) phone, a smartphone, or some other suitable terminology. A UE may be an apparatus that provides a user with access to network services.

The mobile device 100 includes a front cover 102, a middle frame 106, a printed circuit board (PCB) 108, a battery 110, and a back housing 112. In the example shown in FIG. 1, the front cover may include a display 104, which may be, for example, a touch screen. Additional components or variations of illustrated components may also be included within the mobile device 100.

The PCB 108 may include, for example, a plurality of electronic components (e.g., circuits and/or dies) mounted thereon. For example, the various electronic components may be soldered to the PCB 108. The PCB 108 may further facilitate communication between the plurality of electronic components and/or other peripheral devices using, for example, a bus architecture implemented as traces on the PCB. The PCB 108 may further include connectors to various peripheral devices and other external components, such as the display 104 and battery 110.

The middle frame 106 is disposed between the front cover 102 and the PCB 108. By way of example, but not limitation, the middle frame 106 may be composed of aluminum, aluminum alloy, copper, copper alloy, steel, or other metal, metal alloy, or metal compound. The middle frame 106 may have a solid structure, as shown in FIG. 1, or may include openings along one or more sides of the middle frame 106 and/or within the middle frame 106 to accommodate various configurations of the mobile device 100 (e.g., locations of power connectors, volume buttons, cameras, etc.) and to support connections between the PCB 108, the display 104, and the battery 110.

FIG. 2A is a diagram illustrating an exemplary PCB 208 and middle frame 206 of a mobile device. FIG. 2A illustrates a cut-away view of the middle frame 206 exposing a portion of the PCB 208. The PCB 208 includes a plurality of electronic components 202 (e.g., circuits or dies) mounted thereon. By way of example, but not limitation, the electronic components 202 may include a system on a chip (SOC), power management circuit (PMIC), power amplifier (PA), memory chip, modem, and/or other electronic component of a mobile device. In some examples, a SOC may include a central processing unit (CPU), graphics processor unit (GPU), memory controller, random access memory (RAM), and may also include one or more modems (e.g., cellular radio, Bluetooth, Wi-Fi, etc.).

Electromagnetic interference (EMI), also referred to as radio-frequency interference (RMI) when the mobile device is operating in the radio frequency spectrum, may occur between the electronic components 202 on the PCB 208 and/or between the electronic components 202 and external noise sources via electromagnetic induction, electrostatic coupling or conduction. EMI experienced by a particular electronic component 202 may degrade the performance of the electronic component or prevent the electronic component from functioning altogether. To protect mobile devices from EMI, various approaches to shielding electronic components 202 on PCBs 208 have been developed.

FIG. 2B is a diagram illustrating exemplary electromagnetic interference (EMI) shielding of various electronic components of the mobile device. As in FIG. 2A, FIG. 2B illustrates a cut-away view of the middle frame 206 exposing a portion of the PCB 208 including the plurality of electronic components. EMI shielding of the electronic components is facilitated utilizing EMI shield cans 204, each disposed over one of the electronic components. In some examples, the EMI shield cans 204 may be fabricated from metal sheets (e.g., copper, aluminum, or steel) and formed into shapes that fit the electronic components. The EMI shield cans 204 may then be mounted directly to the PCB 208 to fully shroud the circuitry from EMI and/or prevent the circuitry from generating EMI. In other examples, the EMI shield cans 204 may be integrated with the electronic component (e.g., via application of a metallic shielding layer to the top and sides of the electronic component).

In addition to EMI, the performance of a mobile device may be degraded as a result of thermal mitigation due to high power consumption. For example, the performance of a 5G SOC chipset may be thermally limited by the chip junction temperature ($T_j$) and the device surface temperature ($T_{skin}$). Current temperature specifications indicate a maximum skin temperature ($T_{skin}$) of 43° C. and a maximum junction temperature ($T_j$) of 85° C. Once the maximum $T_j$ or $T_{skin}$ is reached during 5G downlink or uplink operations, the 5G throughput performance is degraded to a lower data rate to reduce power consumption, thereby reducing $T_j$ and $T_{skin}$.

Various aspects of the disclosure relate to thermal solutions to reduce both $T_j$ and $T_{skin}$, which can delay the time to reach the maximum $T_j$ and $T_{skin}$, in order to improve 5G performance. In some examples, an evaporative cooler device may be embedded into an EMI shield (e.g., an EMI shield can 204 or other EMI shield layer, such as an EMI shield plate or the middle frame) to provide both EMI shielding and cooling of electronic components on a PCB 208. An example of an evaporative cooler device operates to transfer heat from one end of the device to the other end of the device utilizing evaporation and condensation of a fluid (e.g., water or ammonia). The EMI shield including the embedded evaporative cooler device may be included within a mobile device, as shown in FIGS. 1, 2A, and/or 2B, or within other suitable devices.

Figure 3:
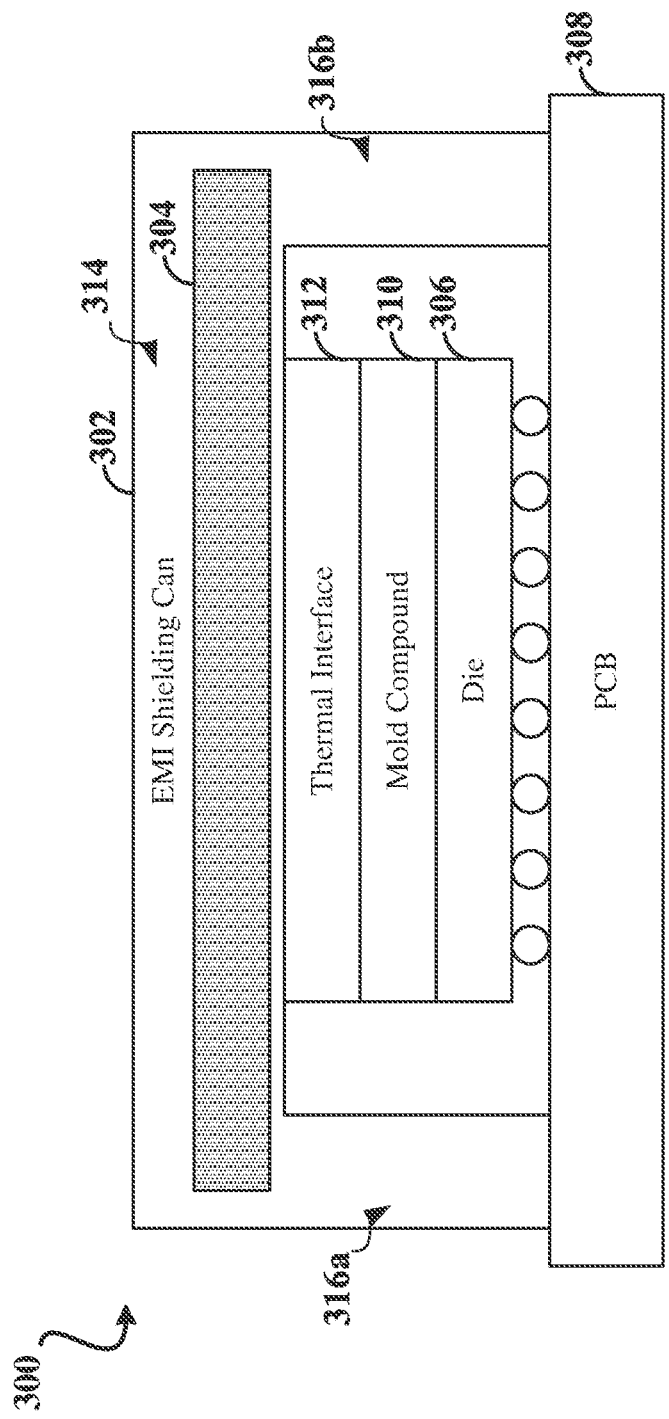
FIG. 3 is a cross-sectional view of an example of an EMI shield can including an embedded evaporative cooler device disposed over an electronic component of the mobile device.

FIG. 3 is a cross-sectional view of an example of a structure 300 including EMI shield 302 (e.g., an EMI shield can) having an embedded evaporative cooler device 304 disposed over an electronic component 306 (e.g., die). The structure 300 may be included in a device, such as a mobile device or other suitable device. The EMI shield 302 including the embedded evaporative cooler device 304 operates to both shield the electronic component 306 (e.g., a high power chip, such as an SOC, PMIC, modem, etc.) from EMI and to cool the electronic component 306 to reduce $T_j$ and $T_{skin}$ of the device.

In the example shown in FIG. 3, the electronic component (e.g., die) 306 is soldered to a PCB 308. A mold compound 310 is disposed on the electronic component 306 and a thermal interface 312 is disposed on the mold compound 310. The EMI shield 302 is then disposed on the thermal interface 312 and mounted to the PCB 308. The EMI shield 302 has a shape selected to surround the electronic component 306, mold compound 310 and thermal interface 312. The EMI shield 302 may include, for example, a top segment 314 configured to cover a top surface of the electronic component 306 (e.g., the thermal interface 312). The EMI shield 302 may further include, for example, a plurality of side segments 316a and 316b (two of which are shown), each configured to cover a respective side of the electronic component 306 (e.g., respective sides of the electronic component 306, mold compound 310, and thermal interface 312).

The evaporative cooler device 304 is embedded within the top segment 314 of the EMI shield 302 such that the top segment 314 of the EMI shield 302 completely surrounds the evaporative cooler device 304 on all surfaces thereof. In addition, the evaporative cooler device 304 has a length at least equal to a length of the electronic component 306. In some examples, the evaporative cooler device 304 extends across substantially an entire length of the top segment 314 of the EMI shield 302 (e.g., the difference in length between the EMI shield 302 and the two-phase-cooling device may be less than or equal to 5 μm), and thus, may have a length greater than the length of the electronic component 306. In some examples, the evaporative cooler device 304 is positioned inside the EMI shield 302 to vertically align with a center of the electronic component 306 to maximize cooling thereof. In some examples, the top segment 314 of the EMI shield 302 may have a thickness of between 200-250 μm, and the evaporative cooler device 304 may have a thickness of between 125-200 μm.

Figure 4:
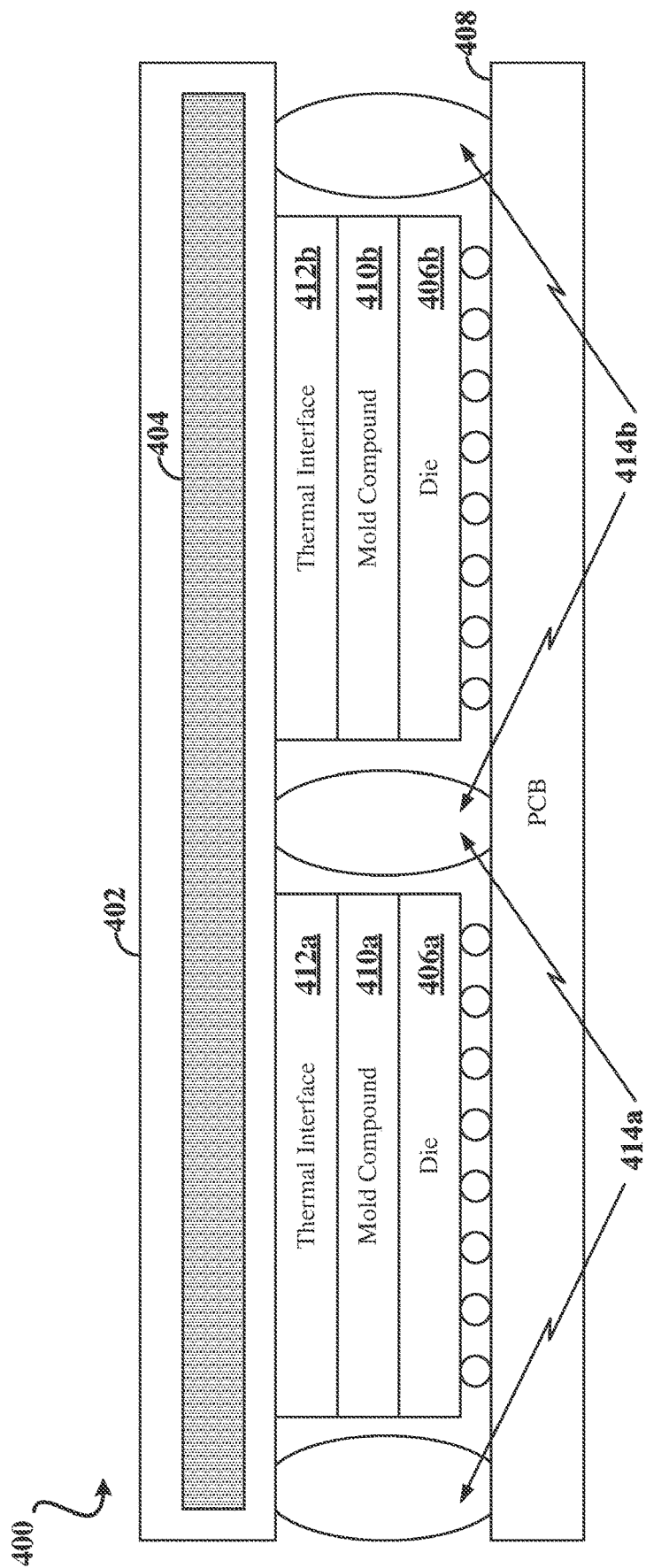
FIG. 4 is a cross-sectional view of an EMI shield plate including an embedded evaporative cooler device disposed over electronic components of the mobile device.

FIG. 4 is a cross-sectional view of an example of a structure 400 including an EMI shield 402 (e.g., an EMI shield plate) having an embedded evaporative cooler device 404 disposed over a plurality of electronic components 406a and 406b (two of which are shown, for convenience). The structure 400 may be included in a device, such as a mobile device or other suitable device. The EMI shield 402 including the embedded evaporative cooler device 404 operates to both shield the electronic components 406a and 406b from EMI and to cool the electronic components 406a and 406b to reduce $T_j$ and $T_{skin}$ of the device.

In the example shown in FIG. 4, each electronic component (e.g., die) 406a and 406b is soldered to a PCB 408 that provides a means for mounting the electronic components 406a and 406b. A respective mold compound 410a and 410b is disposed on the respective electronic component 406a and 406b, and a respective thermal interface 412a and 412b is disposed on the respective mold compound 410a and 410b.

The EMI shield 402 covers at least a portion of the PCB 408. For example, the EMI shield 402 may cover at least the portion of the PCB 408 including the electronic components 406a and 406b. The EMI shield 402 operates as an EMI shield plate to provide a means for preventing EMI between the electronic components 406a and 406b and external noise sources.

The EMI shield 402 is formed of a material surrounding the evaporative cooler device 404. In some examples, the material can include a metallic material or a polymer-based material. For example, the metallic material may include copper, aluminum, steel, titanium, or other suitable metallic materials. In some examples, the EMI shield 402 may be fabricated using a thin copper-based vapor chamber or a polymer-based vapor chamber. In examples in which the EMI shield 402 is formed of a polymer-based material, the EMI shield 402 can further include a metallic coating on the polymer-based material. The metallic coating may include copper, aluminum, nickel, titanium, or other suitable metallic materials. The coating may have a thickness, for example, between 5 micrometers (μm) and 20 μm.

In addition to the EMI shield 402, a plurality of EMI gaskets 414a and 414b are disposed between the EMI shield 402 and the PCB 408 for EMI shielding. For example, the EMI gaskets 414a and 414b may be mounted on the printed circuit board and attached to the EMI shield 402 to form a respective seal around each of the electronic components 406a and 406b. In some examples, the EMI gaskets 414a and 414b can include an electrically conductive rubber material. Each EMI gasket 414a and 414b surrounds a respective one of the electronic components 406a and 406b to provide a means for preventing EMI interference between the electronic components 406a and 406b. Thus, each EMI gasket 414a and 414b, in conjunction with the EMI shield 402, may operate as an EMI shield can to fully shield the electronic components 406a and 406b from EMI and/or to prevent the electronic components 406a and 406b from generating EMI towards other electronic components.

The evaporative cooler device 404 is embedded within the EMI shield 402 such that the EMI shield 402 completely surrounds the evaporative cooler device 404 on all surfaces thereof. In some examples, the evaporative cooler device 404 may extend across substantially an entire length of the EMI shield 402 (e.g., the difference in length between the length of the EMI shield 402 and the length of the evaporative cooler device 404 may be 5 μm or less). In some examples, the EMI shield 402 may have a thickness of between 200-250 μm, and the evaporative cooler device 404 may have a thickness of between 125-200 μm.

The evaporative cooler device 404 enables thermal coupling and heat spreading among the electronic components 406a and 406b to reduce the surface temperature of the device and the respective die temperatures of high-power electronic components. As such, the evaporative cooler device 404 provides a means for transferring heat away from at least a portion of the electronic components 406a and 406b during operation thereof. In an example in which electronic component 406a (Die-1) is a high-power electronic component and electronic component 406b (Die-2) is a low-power electronic component, the evaporative cooler device 404 within the EMI shield 402 may enhance heat transfer to move heat from Die-1 to Die-2 to achieve heat spreading and reduce both the junction temperature $T_j$ of Die-1 and the surface temperature $T_{skin}$ of the device.

Figure 5:
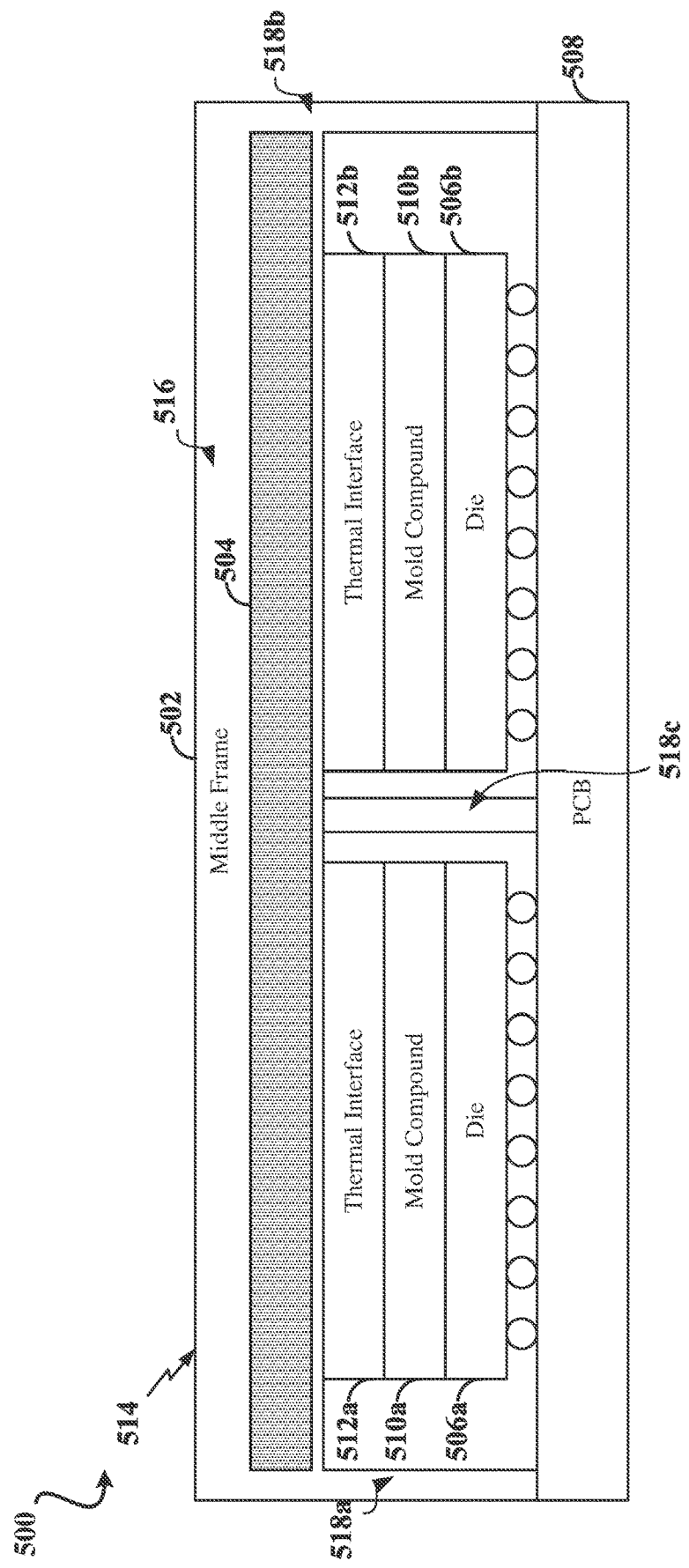
FIG. 5 is a cross-sectional view of an example of a middle frame including an embedded evaporative cooler device disposed over various electronic components of the mobile device.

FIG. 5 is a cross-sectional view of an example of a structure 500 including an EMI shield 502 (e.g., a middle frame) having an embedded evaporative cooler device 504 disposed over various electronic components 506a and 506b (two of which are shown, for convenience). The structure 500 may be included in a device, such as a mobile device or other suitable device. The EMI shield 502 including the embedded evaporative cooler device 504 operates to shield the electronic components 506a and 506b (e.g., a high power chip, such as an SOC, PMIC, modem, etc., or a low-power chip) from EMI, to cool the high-power electronic components 506a and 506b, and to provide mechanical and structural support for a PCB 508 and chipsets (e.g., electronic components 506a and 506b) mounted on the PCB 508. In addition, as EMI shielding is provided by the EMI shield 502, the device may not include an additional EMI shield layer or additional EMI shield cans over individual electronic components 506a and 506b, thereby reducing the overall form factor of the device and simplifying the device assembling process.

In the example shown in FIG. 5, each electronic component (e.g., die) 506a and 506b is soldered to the PCB 508, a respective mold compound 510a and 510b is disposed on the respective electronic component 506a and 506b, and a respective thermal interface 512a and 512b is disposed on the respective mold compound 510a and 510b.

The EMI shield 502 includes a housing 514 covering at least a portion of the PCB 508. For example, the housing 514 may cover the portion of the PCB 508 including the electronic components 506a and 506b. In some examples, the housing 514 may be mounted or otherwise disposed on the PCB 508 at respective edges thereof. The EMI shield housing 514 may include a top segment 516 disposed on the electronic components 506a and 506b (e.g., the thermal interfaces 512a and 512b), external side segments 518a and 518b, and a plurality of internal side segments 518c (one of which is shown, for convenience). The external side segments 518a and 518b form the sides of the EMI shield housing 514. The internal side segments 518c are positioned on a bottom surface of the top segment 516 at locations that align with the electronic components 506a and 506b such that the internal side segments 518c, together with the external side segments 518a and 518b, form respective EMI shield cans surrounding each of the electronic components 506a and 506b.

The top segment 516 of the EMI shield housing 514 operates as an EMI shield layer to prevent EMI between the electronic components 506a and 506b and external noise sources. The side segments 518a, 518b, and 518c of the EMI shield housing 514 further serve to prevent EMI interference between the electronic components 506a and 506b. In some examples, the EMI shield 502 is formed of a metallic material, such as copper, aluminum, steel, or other suitable metallic materials.

The evaporative cooler device 504 enables thermal coupling and heat spreading among the electronic components 506a and 506b to reduce the surface temperature of the device ($T_{skin}$) and the respective die temperatures ($T_j$) of high-power electronic components. The evaporative cooler device 504 is embedded within the top segment 516 of the EMI shield housing 514 such that the metallic material of the EMI shield 502 completely surrounds the evaporative cooler device 504 on all surfaces thereof. In some examples, the evaporative cooler device 504 may extend across substantially an entire length of the top segment 516 of the EMI shield 502 (e.g., the difference in length between the top segment 516 of the EMI shield 502 and the evaporative cooler device 504 may be 5 µm or less), and thus, may have a length greater than the length of either of the electronic components 506a and 506b. In some examples, the top segment 516 of the EMI shield 502 may have a thickness of between 200-250 µm, and the evaporative cooler device 504 may have a thickness of between 125-200 µm.

Figure 6:
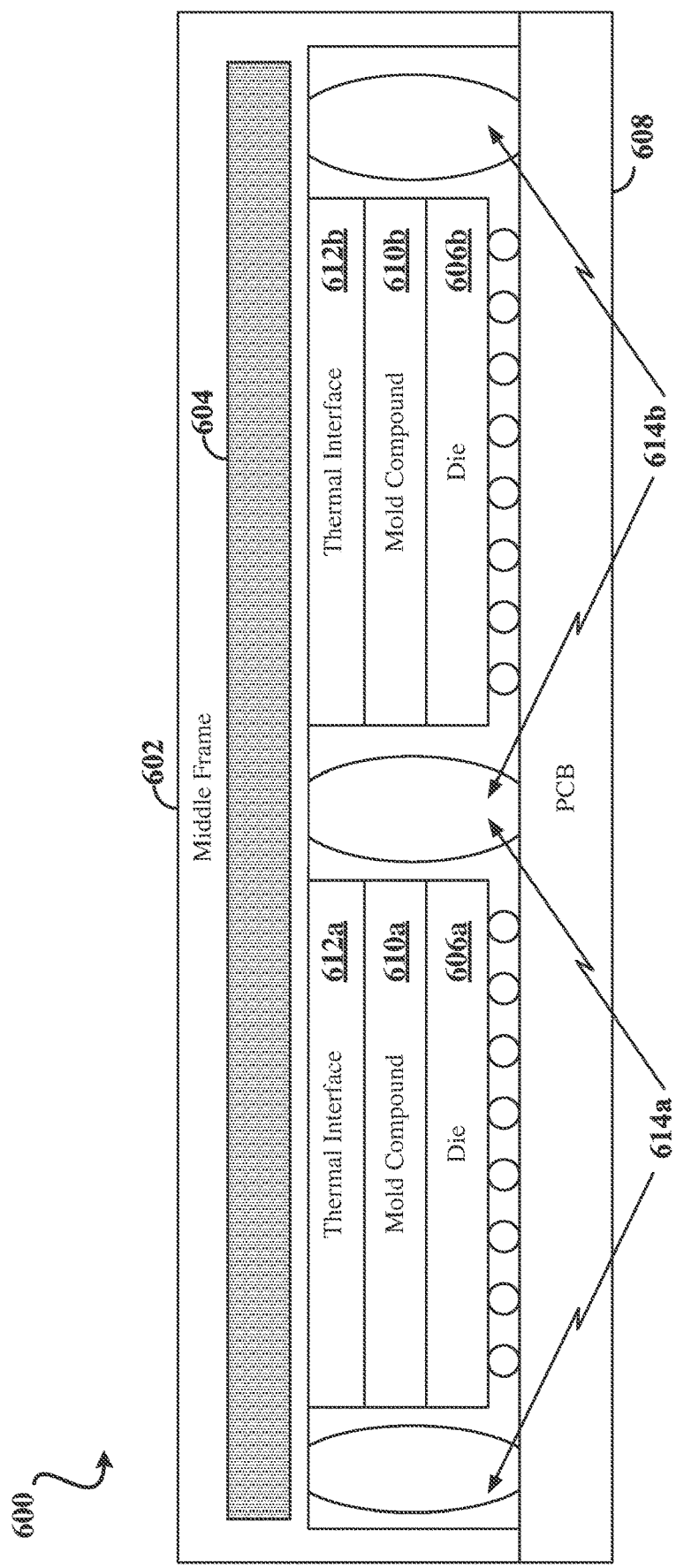
FIG. 6 is a cross-sectional view of another example of a middle frame including an embedded evaporative cooler device disposed over various electronic components of the mobile device.

FIG. 6 is a cross-sectional view of another example of a structure 600 including an EMI shield 602 (e.g., a middle frame) having an embedded evaporative cooler device 604 disposed over various electronic components 606a and 606b (two of which are shown, for convenience). The structure 600 may be included in a device, such as a mobile device or other suitable device. Each electronic component (e.g., die) 606a and 606b is soldered to a PCB 608, a respective mold compound 610a and 610b is disposed on the respective electronic component 606a and 606b, and a respective thermal interface 612a and 612b is disposed on the respective mold compound 610a and 610b.

As in FIG. 5, the EMI shield 602 operates to provide mechanical and structural support for the PCB 608 and chipsets (e.g., electronic components 606a and 606b) mounted on the PCB 608. In addition, the EMI shield 602 further operates to shield the electronic components 606a and 606b (e.g., high-power or low-power chips) from EMI resulting from external noise sources. However, in the example shown in FIG. 6, EMI between the electronic components 606a and 606b is prevented using EMI gaskets 614a and 614b instead of additional internal side segments of the EMI shield. The EMI gaskets 614a and 614b are disposed between the top segment of the EMI shield 602 and the PCB 608 for EMI shielding to form a respective seal around each of the electronic components 606a and 606b. In some examples, the EMI gaskets 614a and 614b can include an electrically conductive rubber material. As EMI shielding is provided by the EMI shield 602 and EMI gaskets 614a and 614b, the device may not include an additional EMI shield plate or additional EMI shield cans over individual electronic components, thereby reducing the overall form factor of the device and simplifying the device assembling process.

The evaporative cooler device 604 embedded within the EMI shield 602 operates to cool high-power electronic components 606a and 606b by facilitating thermal coupling and heat spreading among the electronic components 606a and 606b. In some examples, the evaporative cooler device 604 may extend across substantially an entire length of the EMI shield 602 (e.g., the difference in length between the EMI shield 602 and the evaporative cooler device 604 may be 5 µm or less). In some examples, the EMI shield 602 may have a thickness of between 200-250 µm, and the evaporative cooler device 604 may have a thickness of between 125-200 µm.

Figure 7:
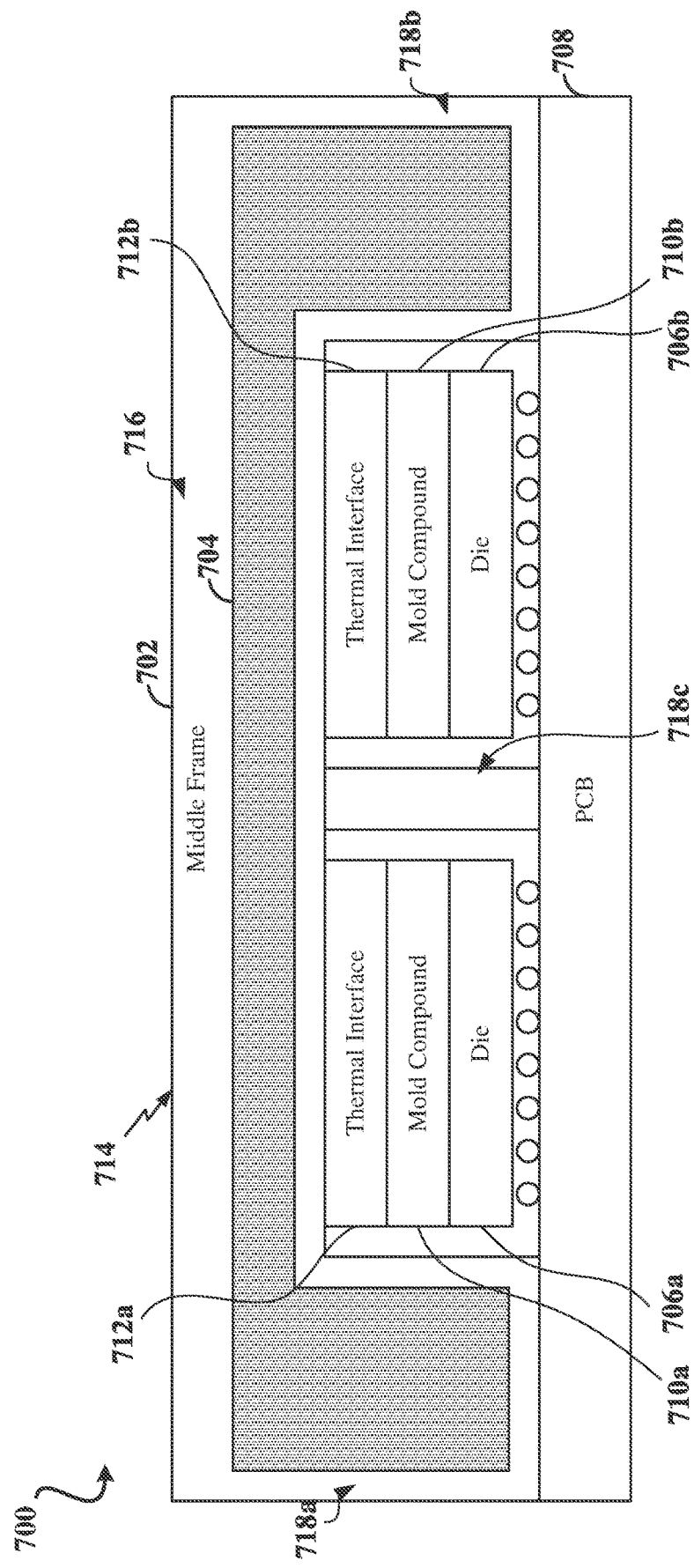
FIG. 7 is a cross-sectional view of another example of a middle frame including an embedded evaporative cooler device disposed over various electronic components of the mobile device.

FIG. 7 is a cross-sectional view of another example of a structure 700 including an EMI shield 702 (e.g., a middle frame) having an embedded evaporative cooler device 704 disposed over various electronic components 706a and 706b (two of which are shown, for convenience). The structure 700 may be included in a device, such as a mobile device or other suitable device. In the example shown in FIG. 7, each electronic component (e.g., die) 706a and 706b is soldered to a PCB 708, a respective mold compound 710a and 710b is disposed on the respective electronic component 706a and 706b, and a respective thermal interface 712a and 712b is disposed on the respective mold compound 710a and 710b.

As in FIG. 5, the EMI shield 702 including the embedded evaporative cooler device 704 shown in FIG. 7 operates to shield the electronic components 706a and 706b (e.g., high-power or low-power chips) from EMI, to cool the high-power electronic components 706a and 706b, and to provide mechanical and structural support for the PCB 708 and chipsets (e.g., electronic components 706a and 706b) on the PCB 708. In addition, the EMI shield 702 includes a housing 714 covering at least a portion of the PCB 708. For example, the EMI shield housing 714 may cover at least the portion of the PCB 708 including the electronic components 706a and 706b. The EMI shield housing 714 further includes a top segment 716 disposed on the electronic components 706a and 706b (e.g., the thermal interfaces 712a and 712b), external side segments 718a and 718b (two of which are shown, for convenience), and a plurality of internal side segments 718c (one of which is shown, for convenience). The internal side segments 718c, together with the external side segments 718a and 718b, form respective EMI shield cans around each of the electronic components 706a and 706b. In other examples, EMI gaskets may be used instead of the internal side segments to form respective seals around each of the electronic components 706a and 706b, as shown in FIG. 6.

In the example shown in FIG. 7, the evaporative cooler device 704 is embedded within the top segment 716 of the EMI shield housing 714 and is further embedded within the external side segments 718a and 718b of the EMI shield housing 714 such that the metallic material (e.g., copper, aluminum, or steel) of the EMI shield 702 completely surrounds the evaporative cooler device 704 on all surfaces thereof. In some examples, the external side segments 718a and 718b are disposed on respective sides (e.g., edges) of the PCB 708 and form the sides of the EMI shield housing 714. Thus, in this example, the evaporative cooler device 704 surrounds all of the electronic components 706a and 706b on at least two sides thereof.

In some examples, the evaporative cooler device 704 may extend across substantially an entire length of the EMI shield 702, and thus, may have a length greater than the length of either of the electronic components 706a and 706b. In some examples, the top segment 716 of the EMI shield housing 714 and each of the side segments 718a and 718b including the evaporative cooler device 704 may have a thickness of between 300-1000 µm, and the evaporative cooler device 704 may have a thickness of between 100-800 µm. In some examples, as shown in FIG. 7, the thickness of the evaporative cooler device 704 may vary such that the thickness within the top segment 716 of the EMI shield housing 714 may be less than the thickness within the side segments 718a and 718b of the EMI shield housing 714.

Figure 8:
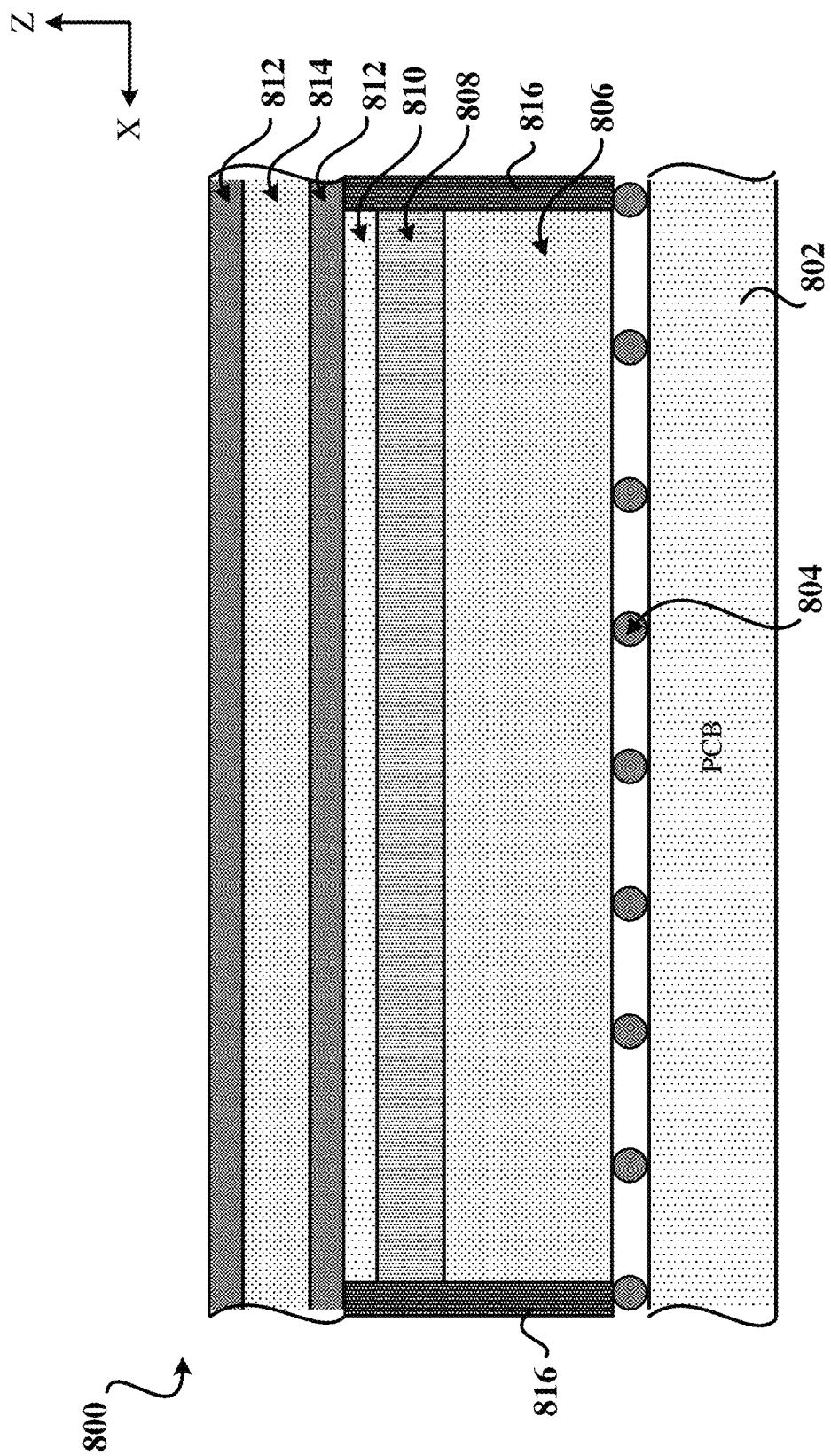
FIG. 8 illustrates a profile view of an integrated device that includes the EMI shield with embedded evaporative cooler device.

FIG. 8 illustrates a profile view of an integrated device 800 that includes the EMI shield with embedded evaporative cooler device. The integrated device 800 may form a portion of any of the structures shown in FIG. 4, 6, or 7. The integrated device 800 includes a PCB 802, solder balls 804, an electronic component (e.g., a die) 806, a mold compound 808, thermal interface 810, the EMI shield 812 with the embedded evaporative cooler device 814, and an EMI gasket 816.

The electronic component 806 is attached to (e.g., mounted on) the PCB 802 via the solder balls 804. The mold compound 808 is formed over the electronic component 806 and the thermal interface 810 is formed over the mold compound 808. The EMI gasket 816 surrounds the electronic component 806, the mold compound 808 and the thermal interface 810. The EMI gasket 816 is further attached to (e.g., mounted on) on the PCB 802 via the solder balls 804. The EMI shield 812 including the embedded evaporative cooler device 814 is disposed on the thermal interface 810 and attached to the EMI gasket using solder, an adhesive compound, or any other suitable adhesive material. Thus, the EMI shield 812, PCB 802, and EMI gasket 816 collectively form a seal around the electronic component 806 to prevent EMI between the electronic component 806 and other electronic components on the PCB 802 and between the electronic component 806 and external noise sources.

Figure 9:
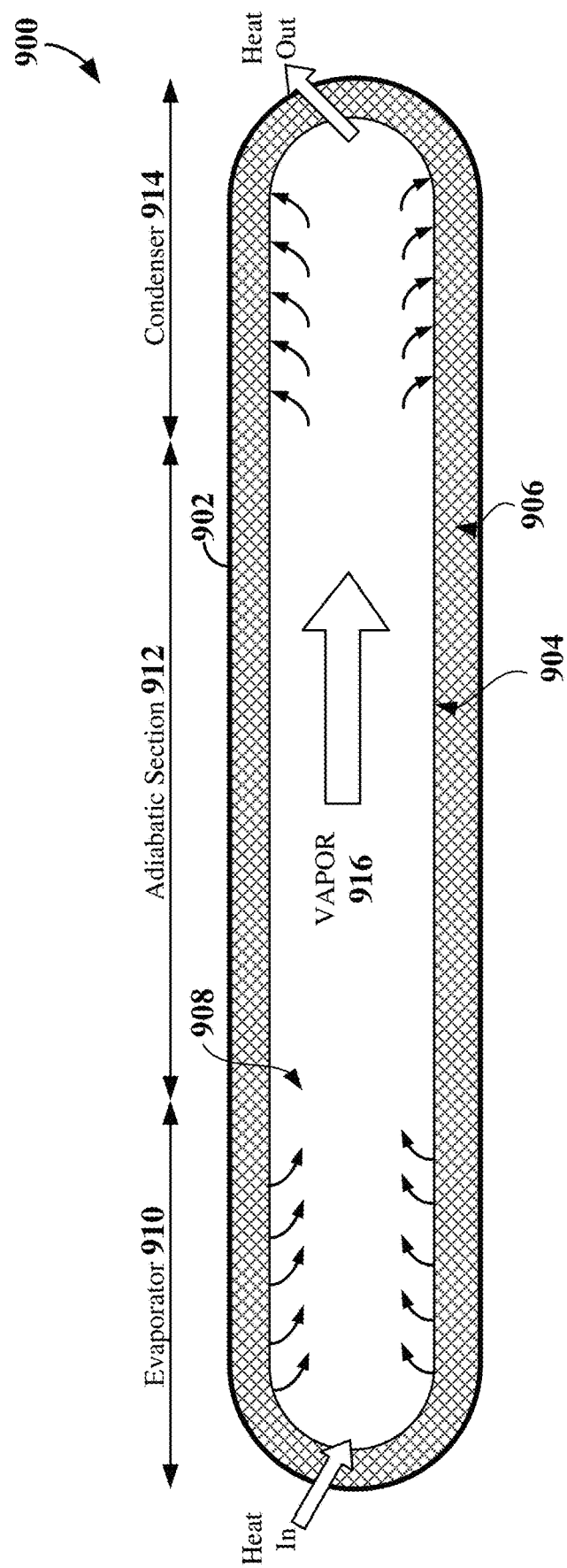
FIG. 9 is a cross-sectional view of an example of an evaporative cooler device.

FIG. 9 is a cross-sectional view of an example of an evaporative cooler device 900. The evaporative cooler device 900 may correspond to the evaporative cooler device shown in any of FIGS. 3-8. For example, the evaporative cooler device 900 may be a two-phase cooling device. In the example shown in FIG. 9, the evaporative cooler device 900 includes an envelope 902, a vapor chamber 904, and a wicker structure 906.

The evaporative cooler device 900 is configured as a sealed pipe or tube, in which the envelope 902 is made of a material compatible with a working fluid 908 inside of the vapor chamber 904. The working fluid 908 may include distilled water, ammonia, methanol, acetone, R134a, or other suitable working fluid. For example, if the fluid 908 includes distilled water, the envelope 902 may be made of copper, whereas if the fluid 908 includes ammonia, the envelope 902 may be made of aluminum. The vapor chamber 904 is surrounded by the wicker structure 906 and is partially filled with the fluid 908, so that the vapor chamber 904 may contain both vapor and liquid over the operating temperature range. In some examples, the wicker structure 906 may include a sintered metal powder wick, a screen wick, or a grooved wick. Grooved wicks may have a series of grooves parallel to the axis of the evaporative cooler device.

The evaporative cooler device 900 may be divided into an evaporator section 910, an adiabatic section 912 and a condenser section 914. As heat is dissipated into the evaporator section 910 of the evaporative cooler device 900, the fluid 908 in the vapor chamber 904 begins to vaporize to produce a vapor 916 near the center (middle) of the vapor chamber 904. The adiabatic section 912 then transports the vapor 916 through the vapor chamber 904 to the condenser section 914, which releases the latent heat and condenses the vapor 916 back to liquid. The liquid (fluid 908) may then return to the evaporator section 910 by capillary force through the wicker structure 906. In some examples, the evaporative cooler device 900 may achieve a thermal conductivity of 10,000-30,000 W/m-K, which may reduce $T_{skin}$ and $T_j$ of electronic components (e.g., SOC) on the PCB, thus delaying the time for each of those electronic components to reach the maximum $T_j$ and $T_{skin}$, in order to improve 5G performance. In some examples, $T_{skin}$ may be reduced between 2 and 10° C., and $T_j$ may be reduced between 5 and 15° C.

Figure 10:
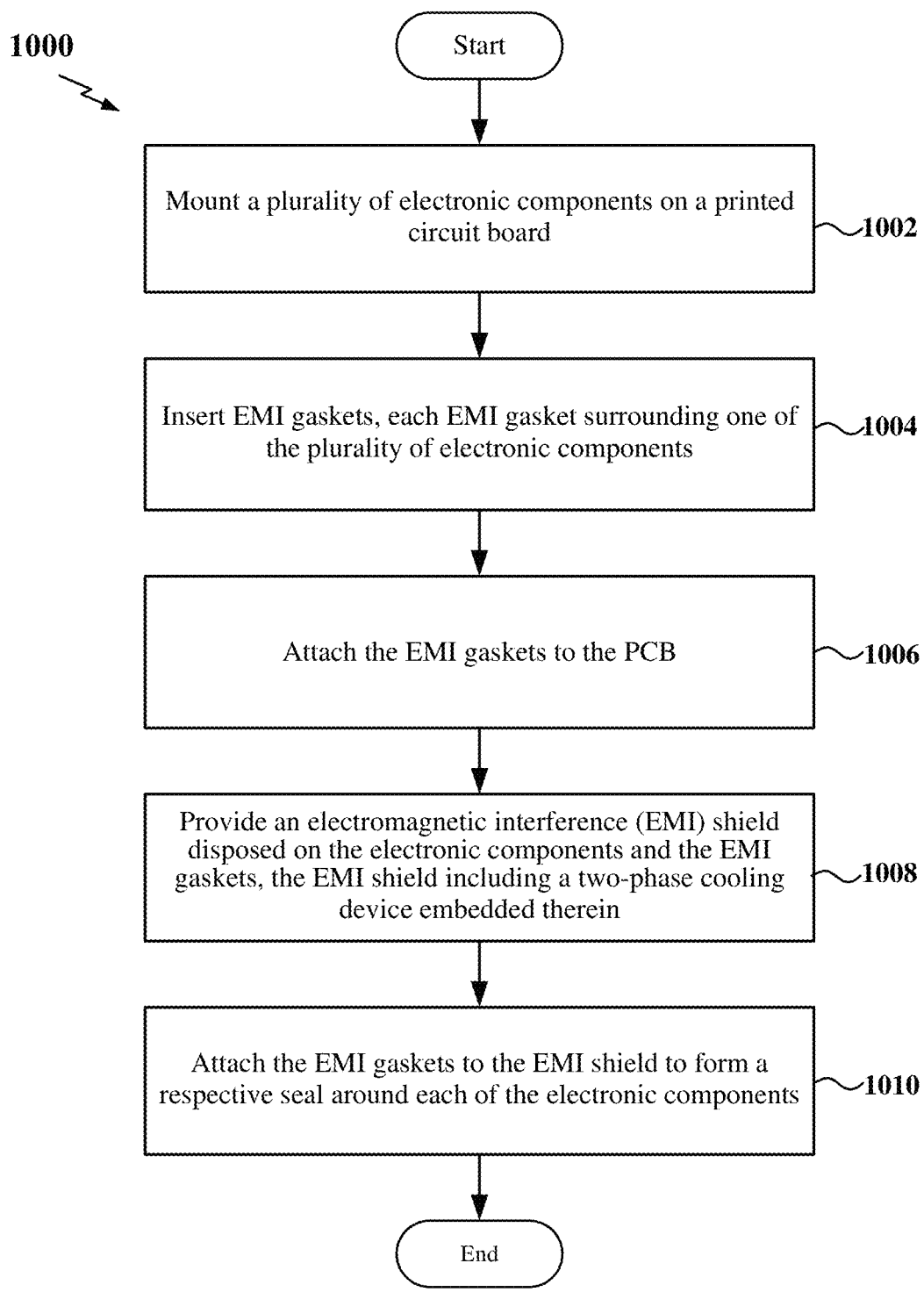
FIG. 10 is a flow chart of an exemplary method for fabricating a device including an EMI shield with an embedded evaporative cooler device.

FIG. 10 is a flow chart of an exemplary method 1000 for fabricating a device including an EMI shield with an embedded evaporative cooler device. As described below, some or all illustrated features may be omitted in a particular implementation within the scope of the present disclosure, and some illustrated features may not be required for implementation of all embodiments. In some examples, the method 1000 may be utilized in fabricating the mobile device 100 shown in FIG. 1, or other suitable device. The method 1000 may also be used to fabricate any of the structures or integrated devices shown in FIGS. 4-8 or other suitable structures or integrated devices.

At block 1002, a plurality of electronic components may be mounted on printed circuit board (PCB) within the device. The electronic components may include, for example, a system on a chip (SOC), power management circuit (PMIC), power amplifier (PA), memory chip, modem, and/or other electronic components of the device. The electronic components may be mounted on the PCB via, for example, solder balls.

At block 1004, EMI gaskets may be inserted in the device such that each EMI gasket is surrounding one of the plurality of electronic components. In some examples, the EMI gaskets are formed of an electrically conductive rubber material.

At block 1006, the EMI gaskets may be attached to the PCB. For example, the EMI gaskets may be attached to the PCB by mounting the EMI gaskets on the PCB via, for example, solder balls.

At block 1008, an EMI shield may be provided that is disposed on the plurality of electronic components and the EMI gaskets. The EMI shield may include, for example, an EMI shield plate, as shown in FIG. 4, or a middle frame, as shown in FIGS. 5-7. In examples in which the EMI shield is a middle frame, the middle frame may further serve to provide internal mechanical and structural support for the mobile device. The EMI shield may further include an evaporative cooler device embedded therein. In some examples, the evaporative cooler device may include a device as shown in FIG. 9.

At block 1010, the EMI gaskets may be attached to the EMI shield to form a respective seal around each of the electronic components. The seal may operate to prevent EMI between the respective electronic components and between the electronic components and external noise sources. In some examples, the EMI gasket may be attached to the EMI shield using any suitable adhesive material.

Figure 11:
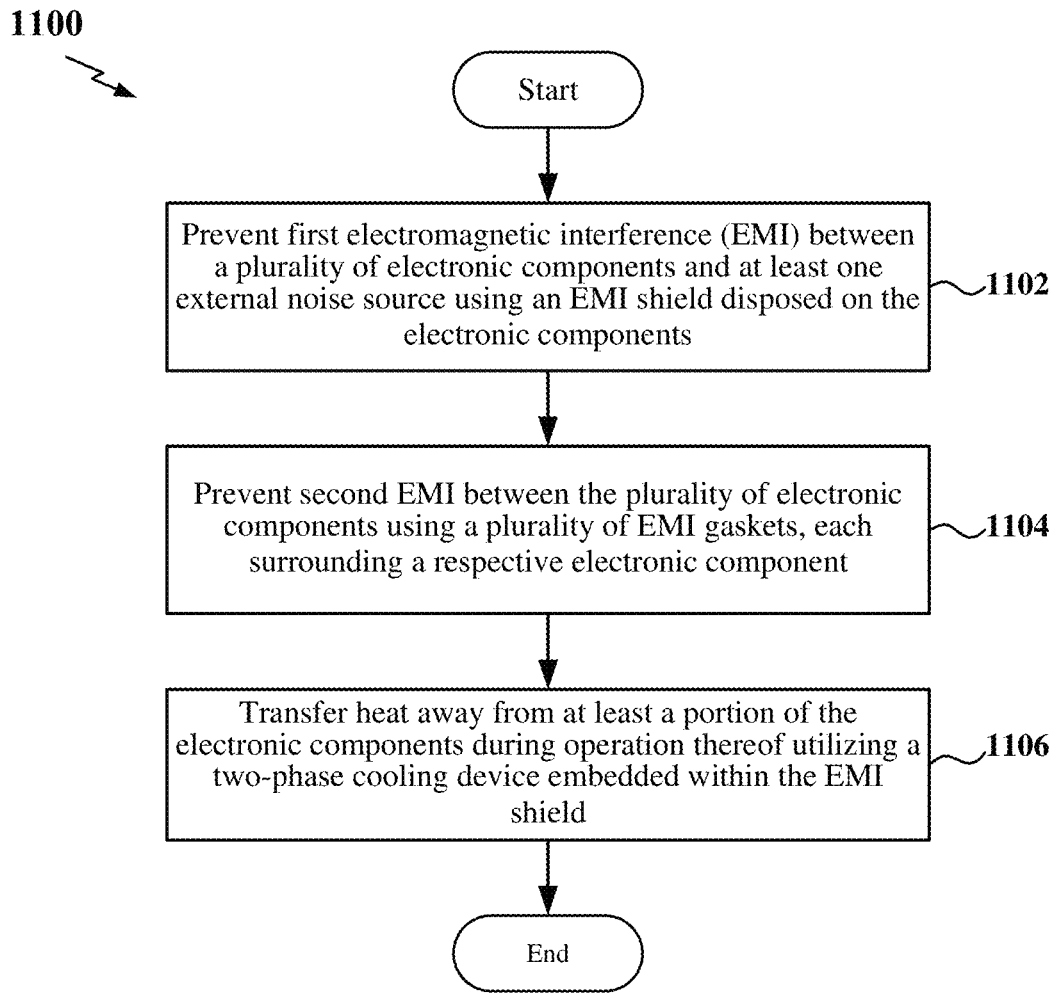
FIG. 11 is a flow chart of an exemplary method for thermal management in a device.

FIG. 11 is a flow chart of an exemplary method 1100 for thermal management in a device. As described below, some or all illustrated features may be omitted in a particular implementation within the scope of the present disclosure, and some illustrated features may not be required for implementation of all embodiments. In some examples, the method may be utilized during operation of the mobile device 100 shown in FIG. 1, or other suitable device. The method 1100 may also be used during operation of any of the structures or integrated devices shown in FIGS. 4-8 or other suitable structures or integrated devices.

At block 1102, first electromagnetic interference (EMI) may be prevented between a plurality of electronic components within a device or other structure and at least one external noise source external to the device or structure during operation of the plurality of electronic components using an EMI shield disposed on the plurality of electronic components.

At block 1104, second EMI may be prevented between the plurality of electronic components during operation thereof using a plurality of EMI gaskets. Each of the plurality of EMI gaskets can surround a respective one of the plurality of electronic components to prevent the second EMI.

At block 1106, heat may be transferred away from at least a portion of the plurality of electronic components during operation thereof utilizing an evaporative cooler device embedded in the EMI shield. For example, the evaporative cooler device may include a liquid (working fluid) that when heated turns into a vapor. The vapor may then travel along the evaporative cooler device to the other end, where the vapor condenses back into a liquid, thus releasing the latent heat.

Figure 12:
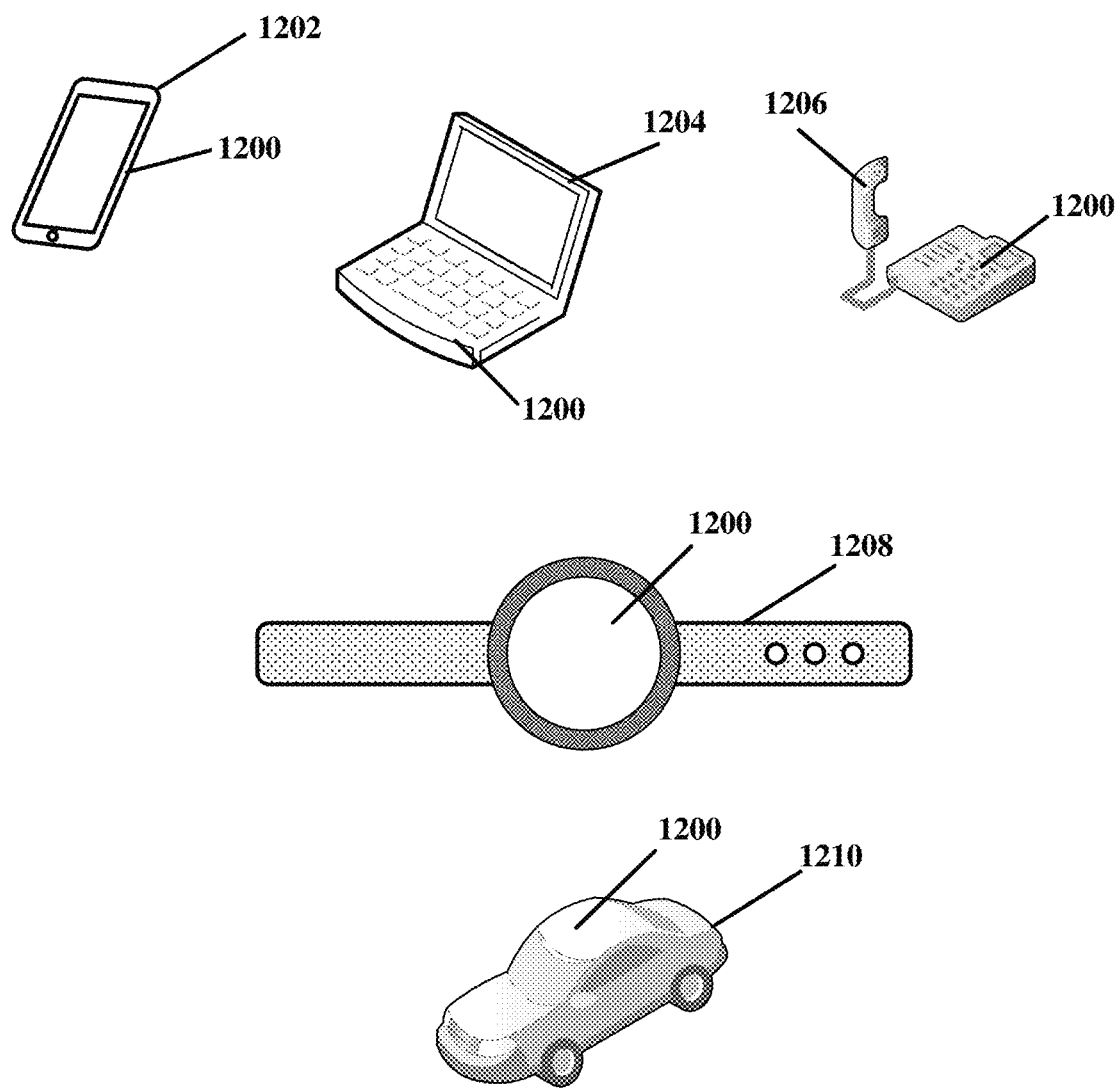
FIG. 12 illustrates various electronic devices that may integrate a die, an integrated device, a package, and/or a device package described herein.

FIG. 12 illustrates various electronic devices that may be integrated with any of the aforementioned device, integrated device, structure, integrated circuit (IC) package, integrated circuit (IC) device, semiconductor device, integrated circuit, die, interposer, package, package-on-package (PoP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

In one configuration, the device (e.g., mobile device 100 or other suitable device) includes means for preventing first electromagnetic interference (EMI) between a plurality of electronic components of the device and at least one external noise source external to the device during operation of the plurality of electronic components. The means for preventing the first EMI is disposed on the plurality of electronic components. The device further includes means for preventing second EMI between the plurality of electronic components during operation thereof. The means for preventing the second EMI is disposed between the electronic components and configured to form respective seals around each of the plurality of electronic components. The device further includes means for transferring heat away from at least a portion of the plurality of electronic components during operation thereof. The means for transferring heat is embedded within the means for preventing the first EMI.

In one aspect, the means for preventing first EMI may be the EMI shield 402, 502, 602, 702, or 812 shown in FIGS. 4-8. In addition, the means for preventing second EMI may be the EMI gaskets 414a and 414b shown in FIG. 4, the EMI gaskets 614a and 614b shown in FIG. 6, or the EMI gasket 816 shown in FIG. 8. Furthermore, the means for transferring heat away from at least the portion of the plurality of electronic components may be the evaporative cooler device 404, 504, 604, 704, 814, or 900 shown in FIGS. 4-9. In another aspect, the aforementioned means may be any device, component, or apparatus configured to perform the functions recited by the aforementioned means.

In the following, further embodiments are described in order to facilitate understanding of the invention.

Example 1: A device comprising: a plurality of electronic components, an electromagnetic interference (EMI) shield disposed on the plurality of electronic components, an evaporative cooler device embedded within the EMI shield and configured to transfer heat away from at least a portion of the plurality of electronic components, and a plurality of EMI gaskets disposed between the plurality of electronic components, each of the plurality of EMI gaskets surrounding a respective one of the plurality of electronic components.

Example 2: The device of example 1, wherein the plurality of EMI gaskets comprise an electrically conductive rubber material.

Example 3: The device of examples 1 or 2, further comprising: a printed circuit board having the plurality of electronic components mounted thereon, wherein the printed circuit board, the EMI shield, and the plurality of EMI gaskets form respective seals around each of the plurality of electronic components.

Example 4: The device of examples 1, 2 or 3, wherein the EMI shield comprises metallic material or a polymer-based material surrounding the evaporative cooler device.

Example 5: The device of example 4, wherein the EMI shield plate further comprises a metallic coating on the polymer-based material.

Example 6. The device of any of examples 1 to 5, wherein the EMI shield comprises a middle frame disposed on the plurality of electronic components, wherein the middle frame is configured to provide internal mechanical and structural support for the device.

Example 7: The device of any of examples 1 to 6, wherein: the EMI shield comprises a housing, wherein the housing comprises a top segment disposed on the plurality of electronic components and at least two external side segments disposed on respective sides of the housing; and the evaporative cooler device is embedded within the top segment and the at least two external side segments of the housing.

Example 8: The device of examples 6 or 7, wherein the EMI shield comprises a metallic material.

Example 9: The device of any of examples 1 to 8, wherein the evaporative cooler device comprises a vapor chamber surrounded by a wicker structure, the vapor chamber comprising a working fluid.

Example 10: The device of example 9, wherein the wicker structure comprises a first thickness between 50 and 100 micrometers and the vapor chamber comprises a second thickness between 75 and 125 micrometers.

Example 11: The device of any of examples 1 to 10, wherein the EMI shield comprises a thickness of at least 200 micrometers.

Example 12: The device of any of examples 1 to 11, wherein each of the plurality of electronic components comprises a system-on-a-chip, power management integrated circuit, power amplifier, or a memory chip.

Example 13: A method for fabricating a device, comprising: mounting a plurality of electronic components on a printed circuit board; inserting electromagnetic interference (EMI) gaskets, each of the EMI gaskets surrounding one of the plurality of electronic components; attaching the EMI gaskets to the printed circuit board; providing an electromagnetic interference (EMI) shield disposed on the plurality of electronic components and the EMI gaskets, the EMI shield comprising an evaporative cooler device embedded therein; and attaching the EMI gaskets to the EMI shield to form a respective seal around each of the plurality of electronic components.

Example 14: The method of example 13, wherein the EMI gaskets comprise an electrically conductive rubber material.

Example 15: The method of example 13 or 14, wherein the EMI shield comprises metallic material or a polymer-based material surrounding the evaporative cooler device.

Example 16: The method of example 15, wherein the EMI shield further comprises a metallic coating on the polymer-based material.

Example 17: The method of any of examples 13 or 14, wherein the EMI shield comprises a middle frame disposed on the printed circuit board, and further comprising: providing internal mechanical and structural support for the device using the middle frame.

Example 18: The method of any of examples 13 to 17, wherein: the EMI shield comprises a housing covering at least a portion of the printed circuit board, wherein the housing comprises a top segment disposed on the plurality of electronic components and at least two external side segments disposed on respective sides of the printed circuit board; and the evaporative cooler device is embedded within the top segment and the at least two external side segments of the housing Example 19: The method of any of examples 13 to 18, wherein the evaporative cooler device comprises a vapor chamber surrounded by a wicker structure, the vapor chamber comprising a working fluid.

Example 20: A method for thermal management in a device, comprising: preventing first electromagnetic interference (EMI) between a plurality of electronic components of the device and at least one external noise source external to the device during operation of the plurality of electronic components using an EMI shield disposed on the plurality of electronic components; preventing second EMI between the plurality of electronic components during operation thereof using a plurality of EMI gaskets disposed between the plurality of electronic components, each of the plurality of EMI gaskets surrounding a respective one of the plurality of electronic components; and transferring heat away from at least a portion of the plurality of electronic components during operation thereof utilizing an evaporative cooler device embedded within the EMI shield.

Example 21: The method of example 20, wherein the plurality of EMI gaskets comprise an electrically conductive rubber material.

Example 22: The method of example 20 or 21, wherein the EMI shield comprises metallic material or a polymer-based material surrounding the evaporative cooler device.

Example 23: The method of example 22, wherein the EMI shield further comprises a metallic coating on the polymer-based material.

Example 24: The method of any of examples 20 to 23, wherein the EMI shield comprises a middle frame of the device, and further comprising: providing internal mechanical and structural support for the device during operation thereof using the middle frame.

Example 25: The method of any of examples 20 to 24, wherein: the EMI shield comprises a housing, wherein the housing comprises a top segment disposed on the plurality of electronic components and at least two external side segments disposed on respective sides of the housing; and the evaporative cooler device is embedded within the top segment and the at least two external side segments of the housing.

Example 26: The method of any of examples 20 to 25, wherein the evaporative cooler device comprises a vapor chamber surrounded by a wicker structure, the vapor chamber comprising a working fluid.

Example 27: A device, comprising: means for preventing first electromagnetic interference (EMI) between a plurality of electronic components of the device and at least one external noise source external to the device during operation of the plurality of electronic components, wherein the means for preventing the first EMI is disposed on the plurality of electronic components; means for preventing second EMI between the plurality of electronic components during operation thereof, wherein the means for preventing the second EMI is disposed between the plurality of electronic components and is configured to form respective seals around each of the plurality of electronic components; and means for transferring heat away from at least a portion of the plurality of electronic components during operation thereof, wherein the means for transferring heat is embedded in the means for preventing the first EMI.

Example 28: The device of example 27, wherein the means for preventing the second EMI comprises an electrically conductive rubber material.

Example 29: The device of any of examples 27 or 28, wherein the means for preventing the first EMI comprises metallic material or a polymer-based material surrounding the means for transferring heat.

Example 30: The device of example 29, wherein the means for preventing the first EMI further comprises a metallic coating on the polymer-based material.

Example 31: The device of any of examples 27 to 30, further comprising: means for providing internal mechanical and structural support for the device using the means for preventing first EMI.

Several aspects of a wireless communication network and wireless communication device have been presented with reference to an exemplary implementation. As those skilled in the art will readily appreciate, various aspects described throughout this disclosure may be extended to other telecommunication systems, network architectures and communication standards.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-11 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-9 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A device, comprising:
   a plurality of electronic components;
   an electromagnetic interference (EMI) shield disposed on the plurality of electronic components;
   an evaporative cooler device embedded within the EMI shield and configured to transfer heat away from at least a portion of the plurality of electronic components, wherein the evaporative cooler device comprises a vapor chamber surrounded by a wicker structure, the vapor chamber comprising a working fluid; and
   a plurality of EMI gaskets disposed between the plurality of electronic components, each of the plurality of EMI gaskets surrounding a respective one of the plurality of electronic components.

2. The device of claim 1, wherein the plurality of EMI gaskets comprise an electrically conductive rubber material.

3. The device of claim 1, further comprising:
   a printed circuit board having the plurality of electronic components mounted thereon, wherein the printed circuit board, the EMI shield, and the plurality of EMI gaskets form respective seals around each of the plurality of electronic components.

4. The device of claim 3, wherein EMI shield comprises metallic material or a polymer-based material surrounding the evaporative cooler device.

5. The device of claim 4, wherein the EMI shield further comprises a metallic coating on the polymer-based material.

6. The device of claim 1, wherein the EMI shield comprises a middle frame disposed on the plurality of electronic components, wherein the middle frame is configured to provide internal mechanical and structural support for the device.

7. The device of claim 1, wherein:
   the EMI shield comprises a housing, wherein the housing comprises a top segment disposed on the plurality of electronic components and at least two external side segments disposed on respective sides of the housing; and
   the evaporative cooler device is embedded within the top segment and the at least two external side segments of the housing.

8. The device of claim 7, wherein the EMI shield comprises a metallic material.

9. The device of claim 1, wherein the wicker structure comprises a first thickness between 50 and 100 micrometers and the vapor chamber comprises a second thickness between 75 and 125 micrometers.

10. The device of claim 1, wherein the EMI shield comprises a thickness of at least 200 micrometers.

11. The device of claim 1, wherein each of the plurality of electronic components comprises a system-on-a-chip, power management integrated circuit, power amplifier, or a memory chip.

12. A method for fabricating a device, comprising:
    mounting a plurality of electronic components on a printed circuit board;
    inserting electromagnetic interference (EMI) gaskets, each of the EMI gaskets surrounding one of the plurality of electronic components;
    attaching the EMI gaskets to the printed circuit board;
    providing an EMI shield disposed on the plurality of electronic components and the EMI gaskets, the EMI shield comprising an evaporative cooler device embedded therein, wherein the evaporative cooler device comprises a vapor chamber surrounded by a wicker structure, the vapor chamber comprising a fluid; and
    attaching the EMI gaskets to the EMI shield to form a respective seal around each of the plurality of electronic components.

13. The method of claim 12, wherein the EMI gaskets comprise an electrically conductive rubber material.

14. The method of claim 12, wherein the EMI shield comprises metallic material or a polymer-based material surrounding the evaporative cooler device.

15. The method of claim 14, wherein the EMI shield further comprises a metallic coating on the polymer-based material.

16. The method of claim 12, wherein the EMI shield comprises a middle frame disposed on the printed circuit board, and further comprising:
    providing internal mechanical and structural support for the device using the middle frame.

17. The method of claim 12, wherein:
    the EMI shield comprises a housing covering at least a portion of the printed circuit board, wherein the housing comprises a top segment disposed on the plurality of electronic components and at least two external side segments disposed on respective sides of the printed circuit board; and
    the evaporative cooler device is embedded within the top segment and the at least two external side segments of the housing.

18. A method for thermal management in a device, comprising:
- preventing first electromagnetic interference (EMI) between a plurality of electronic components of the device and at least one external noise source external to the device during operation of the plurality of electronic components using an EMI shield disposed on the plurality of electronic components;
- preventing second EMI between the plurality of electronic components during operation thereof using a plurality of EMI gaskets disposed between the plurality of electronic components, each of the plurality of EMI gaskets surrounding a respective one of the plurality of electronic components; and
- transferring heat away from at least a portion of the plurality of electronic components during operation thereof utilizing an evaporative cooler device embedded within the EMI shield, wherein the evaporative cooler device comprises a vapor chamber surrounded by a wicker structure, the vapor chamber comprising a working fluid.

19. The method of claim 18, wherein the plurality of EMI gaskets comprise an electrically conductive rubber material.

20. The method of claim 18, wherein the EMI shield comprises metallic material or a polymer-based material surrounding the evaporative cooler device.

21. The method of claim 20, wherein the EMI shield further comprises a metallic coating on the polymer-based material.

22. The method of claim 18, wherein the EMI shield comprises a middle frame of the device, and further comprising:
- providing internal mechanical and structural support for the device during operation thereof using the middle frame.

23. The method of claim 18, wherein:
- the EMI shield comprises a housing, wherein the housing comprises a top segment disposed on the plurality of electronic components and at least two external side segments disposed on respective sides of the housing; and
- the evaporative cooler device is embedded within the top segment and the at least two external side segments of the housing.

24. A device, comprising:
- means for preventing first electromagnetic interference (EMI) between a plurality of electronic components of the device and at least one external noise source external to the device during operation of the plurality of electronic components, wherein the means for preventing the first EMI is disposed on the plurality of electronic components;
- means for preventing second EMI between the plurality of electronic components during operation thereof, wherein the means for preventing the second EMI is disposed between the plurality of electronic components and is configured to form respective seals around each of the plurality of electronic components; and
- means for transferring heat away from at least a portion of the plurality of electronic components during operation thereof, wherein the means for transferring heat is embedded in the means for preventing the first EMI, wherein the means for transferring heat comprises a vapor chamber surrounded by a wicker structure, the vapor chamber comprising a working fluid.

25. The device of claim 24, wherein the means for preventing the second EMI comprises an electrically conductive rubber material.

26. The device of claim 24, wherein the means for preventing the first EMI comprises metallic material or a polymer-based material surrounding the means for transferring heat.

27. The device of claim 26, wherein the means for preventing the first EMI further comprises a metallic coating on the polymer-based material.

28. The device of claim 24, further comprising:
- means for providing internal mechanical and structural support for the device using the means for preventing the first EMI.

* * * * *